US009859873B2

(12) United States Patent
Agarwal et al.

(10) Patent No.: US 9,859,873 B2
(45) Date of Patent: Jan. 2, 2018

(54) MINIMIZATION OF BIAS TEMPERATURE INSTABILITY (BTI) DEGRADATION IN CIRCUITS

(71) Applicant: International Business Machines Corporation, Armonk, NY (US)

(72) Inventors: Navin Agarwal, Kolkata (IN); Igor Arsovski, Williston, VT (US); Venkatraghavan Bringivijayaraghavan, Tamilnadu (IN); Krishnan S. Rengarajan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 14/560,109

(22) Filed: Dec. 4, 2014

(65) Prior Publication Data
US 2016/0164497 A1    Jun. 9, 2016

(51) Int. Cl.
| | | |
|---|---|---|
| H03B 1/00 | (2006.01) | |
| H03K 3/011 | (2006.01) | |
| H01L 27/02 | (2006.01) | |
| H03K 17/687 | (2006.01) | |
| H03K 19/003 | (2006.01) | |

(52) U.S. Cl.
CPC .......... *H03K 3/011* (2013.01); *H01L 27/0266* (2013.01); *H03K 17/687* (2013.01); *H03K 19/00369* (2013.01)

(58) Field of Classification Search
CPC ................................................ H03K 17/6872
See application file for complete search history.

(56) References Cited

U.S. PATENT DOCUMENTS

| | | | |
|---|---|---|---|
| 6,570,770 B1 | 5/2003 | Erskine et al. | |
| 6,653,873 B1 * | 11/2003 | Nguyen | H03K 17/164 326/83 |
| 7,009,905 B2 | 3/2006 | Aipperspach et al. | |
| 8,446,214 B2 * | 5/2013 | Tanaka | H02M 3/155 327/538 |

(Continued)

FOREIGN PATENT DOCUMENTS

CN    102437025 A    5/2012

OTHER PUBLICATIONS

Kumar et al., "Adaptive Techniques for Overcoming Performance Degradation due to Aging in Digital Circuits", http://www.ece.umn.edu/~sachin/conf/aspdac09sk.pdf, pp. 284-289, University of Minnesota, Minneapolis MN 55455, 2009 IEEE.

(Continued)

*Primary Examiner* — Hai L Nguyen
(74) *Attorney, Agent, or Firm* — Steven J. Meyers; Daniel M. Cohn; Howard M. Cohn

(57) ABSTRACT

A circuit structure is provided. The circuit structure includes first pfet device. The circuit structure further includes a first nfet device connected to the pfet device. The circuit structure further includes a keeper nfet device that reduces stress associated with the first nfet device by keeping the first nfet device off during its functional state. The circuit structure further includes a keeper pfet device that reduces stress associated with the first pfet device by keeping the first pfet device off during its functional state.

3 Claims, 5 Drawing Sheets

| | Idle State | Functional State |
|---|---|---|
| PFET | Relaxation | Stress |
| NFET | Reduced Stress | Relaxation |

(56) References Cited

U.S. PATENT DOCUMENTS

| | | | |
|---|---|---|---|
| 9,013,212 B2* | 4/2015 | Kumar | G11C 7/1057 |
| | | | 327/108 |
| 9,225,319 B2* | 12/2015 | Ma | H03K 19/00361 |
| 2005/0134360 A1 | 6/2005 | Aipperspach et al. | |
| 2011/0267107 A1 | 11/2011 | Chern et al. | |
| 2012/0182079 A1 | 7/2012 | Kim et al. | |
| 2013/0002297 A1 | 1/2013 | Jain et al. | |
| 2013/0002327 A1* | 1/2013 | Jain | H03K 19/00315 |
| | | | 327/214 |

OTHER PUBLICATIONS

"Mitigating NBTI Degradation", http://ziyang.eecs.umich.edu/projects/nbti/, Accessed on Dec. 1, 2014, pp. 1-2.

Reddy et al., "Impact of Negative Bias Temperature Instability on Product Parametric Drift", ITC International Test Conference, Texas Instruments Inc., 2004 IEEE, Paper 6.3, pp. 148-155.

* cited by examiner

|      | Idle State | Functional State |
|------|------------|------------------|
| PFET | Relaxation | Stress           |
| NFET | Stress     | Relaxation       |

|      | Idle State       | Functional State |
|------|------------------|------------------|
| PFET | Relaxation       | Stress           |
| NFET | Reduced Stress   | Relaxation       |

| | Idle State | Functional State |
|---|---|---|
| PFET | Stress | Relaxation |
| NFET | Relaxation | Stress |

|      | Idle State    | Functional State |
|------|---------------|------------------|
| PFET | Relaxation    | Stress           |
| NFET | Reduced Stress | Relaxation      |

MINIMIZATION OF BIAS TEMPERATURE INSTABILITY (BTI) DEGRADATION IN CIRCUITS

FIELD OF INVENTION

The present invention relates to integrated circuits, and more particularly to minimization of bias temperature instability (BTI) degradation in integrated circuits.

BACKGROUND

Reliability issues in very large scale integrated (VLSI) integrated circuits have been a growing concern, as technology trends in semiconductor technologies continues to grow and, show progressive downscaling of feature sizes, of the large scale integrated circuits. As an example, one major reliability issue of VLSI is bias temperature instability (BTI), which causes threshold voltage, Vth, of CMOS transistors of the VLSI, to increase over time, under voltage stress, resulting in a temporally-dependent degradation of digital logic circuit delay of VLSI. BTI is also a dominant reliability concern for nano-scale PFET (NBTI) and NFET (PBTI) transistors of VLSI. NBTI (Negative Bias temperature instability) occurs under negative gate voltage (e.g., Vgs=−VDD), and is measured as an increase in the magnitude of threshold voltage. This, consequently, affects P-type metal-oxide-semiconductor (PMOS) transistor, and degrades device drive current, circuit speed, noise margin, and the matching property of the integrated circuit.

SUMMARY

According to one embodiment, a circuit structure is provided for minimizing bias temperature instability (BTI) degradation of the circuit structure, is provided. The circuit structure includes a first pfet device. The circuit structure further includes a first nfet device connected to the pfet device. The circuit structure further includes a keeper nfet device that reduces stress associated with the first nfet device by keeping the first nfet device off during its functional state. The circuit structure further includes a keeper pfet device that reduces stress associated with the first pfet device by keeping the first pfet device off during its functional state.

According to another embodiment, a method for minimizing bias temperature instability (BTI) degradation of an integrated circuit, is provided. The method includes providing a first pfet device. The method further includes providing a first nfet device connected to the pfet device. The method further includes providing a keeper nfet device for reducing stress associated with the first nfet device by keeping the first nfet device off during its functional state. The method further includes providing a keeper pfet device for reducing stress associated with the first pfet device by keeping the first pfet device off during its functional state.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
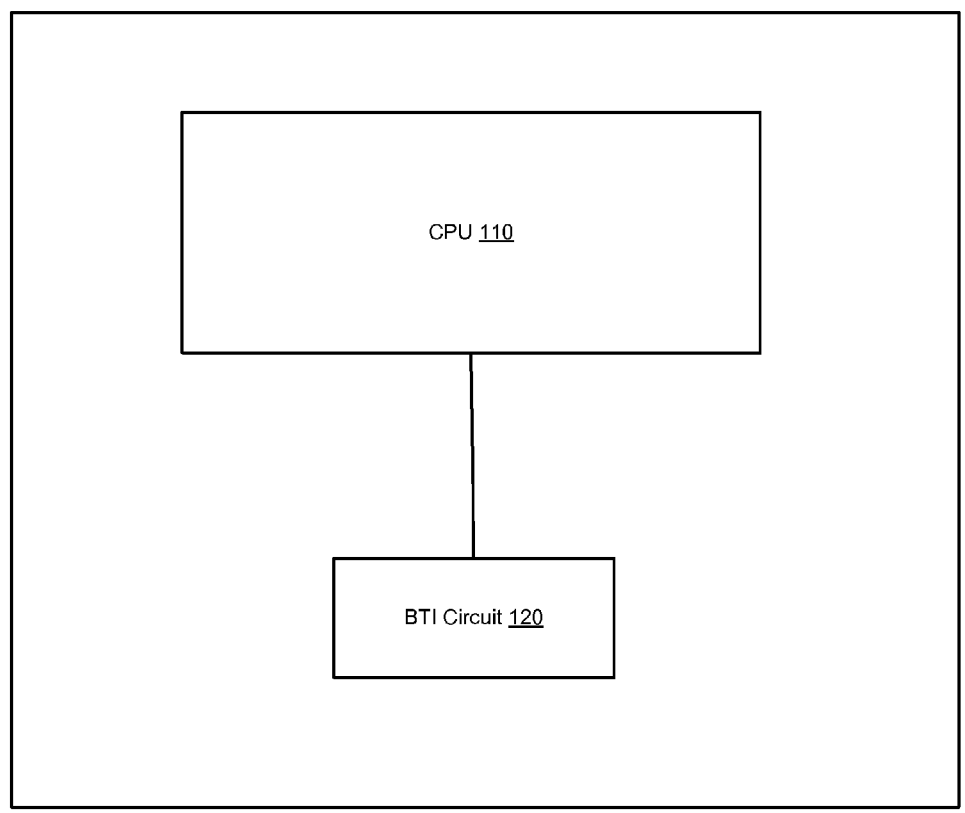
FIG. 1, is an integrated circuit (IC) for affected circuit stress due to bias temperature instability (BTI) degradation of the IC.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As previously described, bias temperature instability (BTI) is a dominant reliability concern for nano-scale PFET (NBTI) and NFET (PBTI) transistors of VLSI. NBTI (Negative Bias temperature instability) occurs under negative gate voltage (e.g., Vgs=−VDD) of integrated circuits, and may be measured as an increase in the magnitude of threshold voltage of the integrated circuits. The NFET device exhibits an increase in non-mobile negative charge during symmetric (source=drain) stress. This shift results in larger magnitude threshold voltages over time (|ID| decreases). The PFET device exhibits an increase in non-mobile positive charge during symmetric (source=drain) stress. This shift results in larger magnitude threshold voltages over time (|ID| decreases). For example, for a matched PFET pair, NBTI can introduce a mismatch shift in several ways. If the gate biases or the equivalent time of the gate biases are not equal in the two PFET devices, this inequality will induce a systematic mismatch in Vt that can be calculated using the NBTI models given in *PFET Negative-Bias Temperature Instability (NBTI)*. Further, process variations across the chip, such as tox, will cause systematic mismatch shifts between widely spaced devices. For closely spaced devices with equal gate biases, NBTI will induce a random mismatch shift in Vt and K such that the mismatch shift mean value is zero, but the s value increases with time Embodiments of the present invention relates to integrated circuits, and more particularly to minimization of bias temperature instability (BTI) degradation of integrated circuits. The embodiments include one or more circuits, or subassemblies of circuits, as well as, a system, computer-implemented methods of operation, or circuit techniques and structure for reducing gate-source voltage of stressed devices, such as reliability phenomena in semiconductor devices e.g. NBTI, PBTI during idle state of the device, thereby putting the device in a relaxation mode. For example, the embodiments include an integrated circuit structure, which includes a first p-channel field-effect transistor (pfet) device, a first n-channel field-effect transistor (nfet) device connected to the device, a keeper n-channel field-effect transistor (nfet) device that reduces stress associated with the first nfet device by keeping the first nfet device off during its functional state, and a keeper pfet device that reduces stress associated with the first pfet device by keeping the first pfet device off during its functional state. The present invention addresses idle state BTI degradation of integrated circuits, surgically and, can be used for critical timing path of the integrated circuits. This will keep the circuit performance of the integrated circuits intact, through burin and life thus improving the product's effective performance significantly or allowing a longer lifetime.

Also, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium.

A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof.

A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA, Smalltalk, C++ or the like, conventional procedural programming languages such as the "C" programming language, a hardware description language such as VERILOG, or similar programming languages. The program code may execute entirely on the user's computer, partly on the user's computer, as a stand-alone software package, partly on the user's computer and partly on a remote computer or entirely on the remote computer or server.

In the latter scenario, the remote computer may be connected to the user's computer through any type of network, including a local area network (LAN) or a wide area network (WAN), or the connection may be made to an external computer (for example, through the Internet using an Internet Service Provider). Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Further aspects of the present invention will now be described in conjunction with the figures. Referring now to FIG. 1, an integrated circuit 100 for affected circuit stress due to bias temperature instability (BTI) degradation of integrated circuit 100, according to embodiments. Integrated circuit (IC) 100 is a set of circuits and subassemblies which can be susceptible to effects caused BTI degradation events.

IC 100 includes central processing unit (CPU) 110 and BIT circuit 120. CPU 110 executes program instructions on IC 100. BTI circuit 120 comprises a BTI structure that includes sensitive circuit elements for reducing gate-source voltage of stressed devices, such as reliability phenomena in semiconductor devices e.g. NBTI, PBTI during idle state of the device, thereby putting the device in a relaxation mode. IC 100 may include additional circuits or components, not depicted, for affected circuit stress BTI degradation of IC 100, according to embodiments.

Figure 2A:
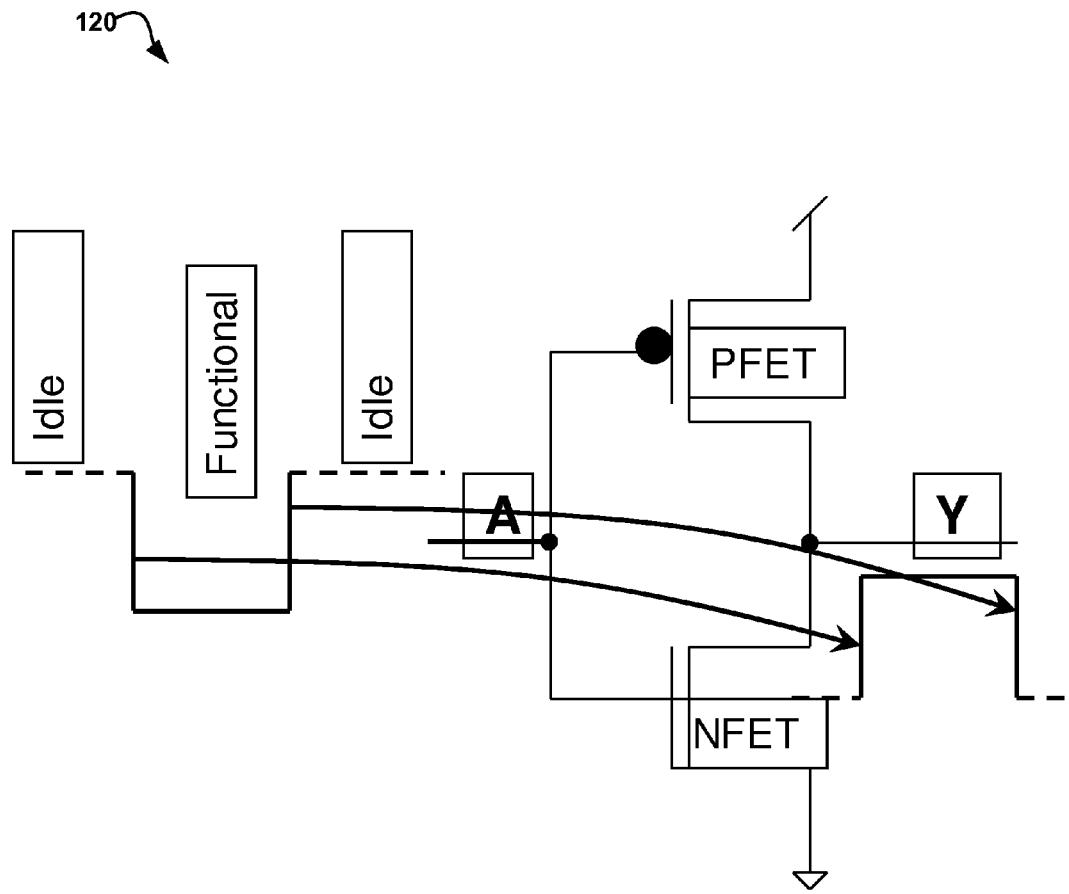
FIG. 2A illustrates a BTI circuit for affected circuit stress due to BTI degradation events of the IC FIG. 1, whereby, a NFET device of the IC, is stressed, during idle state of the IC, according to embodiments.

FIG. 2A illustrates BTI circuit 120 for affected circuit stress due to BTI degradation events of IC 100 of FIG. 1, whereby, a NFET device of IC 100, is stressed, during idle state of IC 100, according to embodiments.

In the illustrated embodiment, pulldown transistor, i.e. NFET, of the BTI circuit 120 is stressed during the idle time. More particularly, as depicted, a tabular capture of the states of stress and relaxation when the IC 100 of FIG. 1 is off, whereby, NFET of the BTI circuit 120 is stressed during idle state of the BTI circuit 120. For example, NFET stress causes a shift of voltage (VT) of the NFET and degrade Wordline fall time of BTI circuit 120. As previously described, BTI occurs in transistors that are ON i.e. there is an electric field between Gate and Source OR Gate and Drain, of the transistors of the IC 100. For example, electrons in operating channel of the transistors, are trapped into the gate oxide defects at the silicon-silicon dioxide interface, or deeper in the oxide due to the Gate to Source, Drain electric field of the integrated circuits. This effectively increases the minimum voltage needed at the gate with respect to the source, to turn on the transistor of IC 100. As such, when the NFET is ON (stressed), the electric field exists possibly causing degradation in the VT of the NFET.

However, alternatively, when the NFET is OFF, for instance, it is possible that some of the trapped electrons transmit back to operating channel of IC 100, due to the reverse electric field of the IC 100. Therefore, this there is some recovery of the VT shift possible when the device is OFF. This is known as operating relaxation state of the IC 100. Idle state is the state of the memory to indicate the state when the memory is not accessed and all the circuits are reset to their default or steady state. Signal Y is an output signal of the BTI circuit 120 for affected circuit stress due to BTI degradation events of IC 100 of FIG. 1, whereby, a NFET device of IC 100, is stressed, during idle state of IC 100, according to embodiments.

Figure 2B:
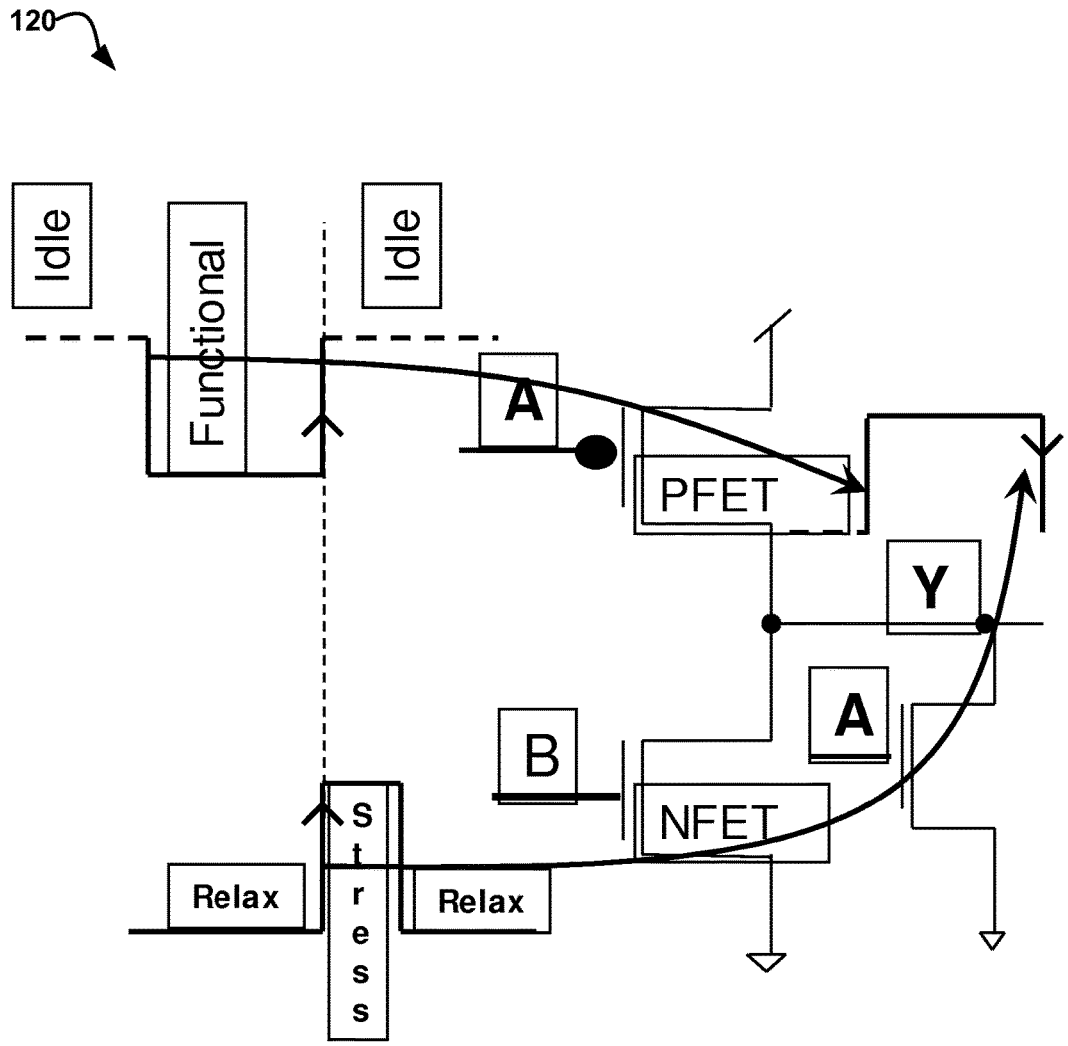
FIG. 2B illustrates a BTI circuit of the IC of FIG. 1, for affected circuit stress BTI degradation events of the IC of FIG. 1, whereby, VT stress is reduced on functional NFET, NFET is OFF(VGS=0), during IDLE state of the IC and, keeper NFET is turned ON, according to embodiments.

FIG. 2B illustrates BTI circuit 120 for affected circuit stress BTI degradation events of IC 100 of FIG. 1, whereby, VT stress is reduced on functional NFET, NFET is OFF (VGS=0), during IDLE state of IC 100 and keeper NFET is turned ON, according to embodiments.

For example, in the depicted embodiment, signal B, which is a short pulse generation, gets trigged, based on a rising edge of signal A. Further, during idle period of IC 100, signal B is low to minimize stress on NFET. Keeper device is turned ON to preserve state and degradation of IC 100.

In illustrated depiction, by adding the keeper device on the IC 100, which keeps the idle state of the wordline driver output, pulse B is generated, to effect the output transition at the required time instant which is the same as the trailing transition of signal A gate of the main NFET device to effect the wordline falling transition. This puts the main NFET device in OFF mode during idle period, thus putting it in relaxation mode for most of its life. The keeper exists to only keep the state low on the wordline, it will still perform its logic function. The signal A is used to shut off the NFET device, and is also used to turn ON the keeper. Signal Y is an output signal of BTI circuit 120 for affected circuit stress BTI degradation events of IC 100 of FIG. 1, whereby, VT stress is reduced on functional NFET, NFET is OFF (VGS=0), during IDLE state of IC 100 and keeper NFET is turned ON, according to embodiments.

Figure 3A:
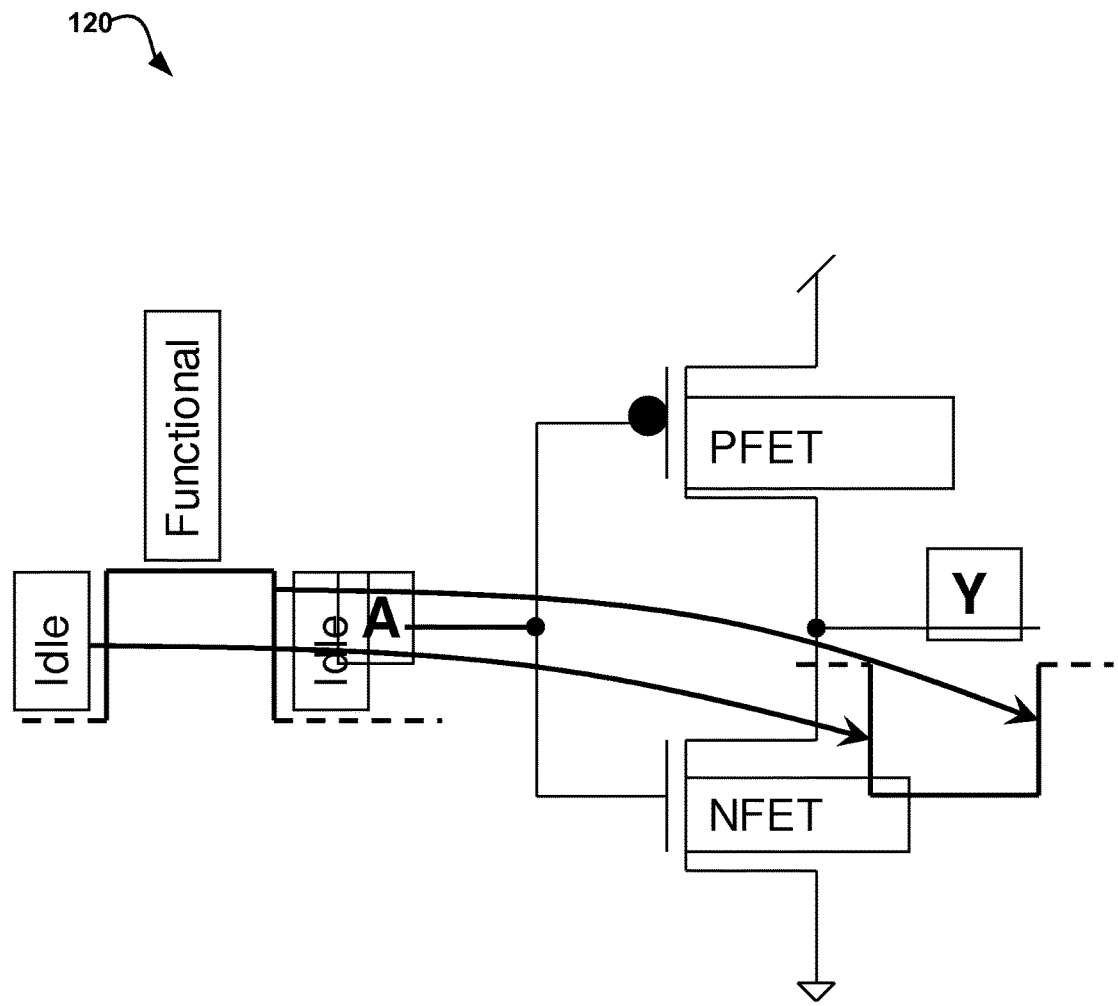
FIG. 3A illustrates a BTI circuit of FIG. 1 for affected circuit stress BTI degradation events of the IC of FIG. 1, whereby, PFET device of IC is stressed, during idle state of the IC, according to embodiments.

FIG. 3A illustrates BTI circuit 120 for affected circuit stress BTI degradation events of IC 100 of FIG. 1, whereby, PFET device of IC 100 is stressed, during idle state of IC 100, according to embodiments.

In the illustrated embodiment, input of the circuit, input A is LOW in idle state of IC 100 and high in operation of IC 100 i.e. the PFET would be ON for most of its life, while the NFET would be ON only during the small functional time. The circuit in FIG. 3A illustrates, PFET and NFET degradation during burin and field operation (operating life) show that the degradation for the PFET is higher than for the NFET during burn. As such, there is some more degradation in the field too, but overall, the PFET which is ON for a lot more time than the NFET, degrades more than the NFET. The circuit in FIG. 3A illustrates the problem with a circuit that has the opposite function of the Wordline driver. Signal Y is an output signal of the BTI circuit 120 for affected circuit stress BTI degradation events of IC 100 of FIG. 1, whereby, PFET device of IC 100 is stressed, during idle state of IC 100, according to embodiments.

Figure 3B:
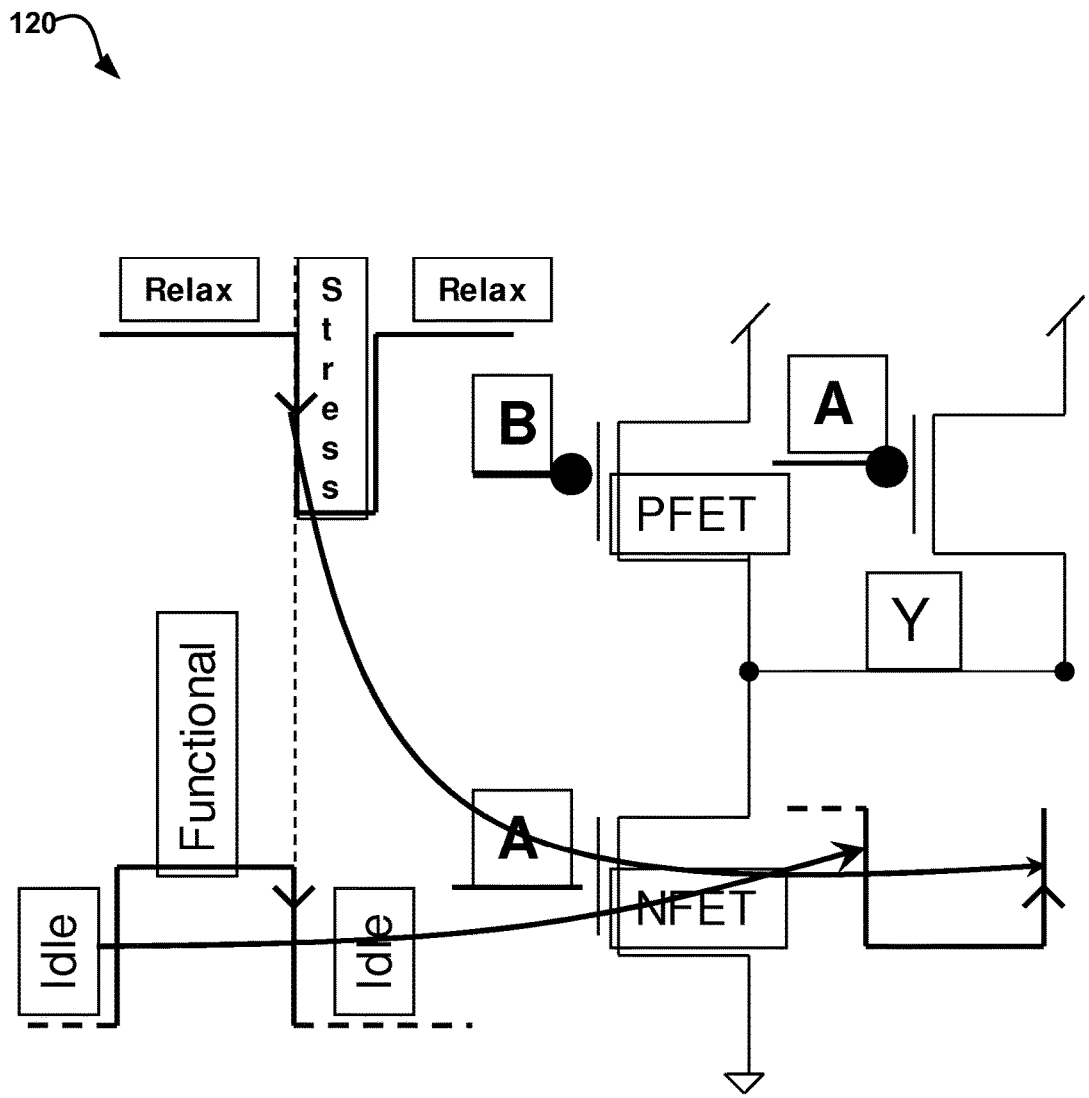
FIG. 3B illustrates a BTI circuit of the IC of FIG. 1, for affected circuit stress BTI degradation events of the IC of FIG. 1, whereby, VT stress is reduced on functional PFET by keeping the IC OFF(VGS=1), during IDLE state of the IC, and keeping keeper PFET ON, according to embodiments.

FIG. 3B illustrates BTI circuit 120 for affected circuit stress BTI degradation events of IC 100 of FIG. 1, whereby, VT stress is reduced on functional PFET by keeping IC 100 OFF(VGS=0), during IDLE state of IC 100, and keeping keeper PFET ON, according to embodiments.

For example, in the depicted embodiment, signal B, which is a short pulse generation, gets trigged, based on a rising edge of signal A. Further, during idle period of IC 100, signal B is high to minimize stress on PFET. Keeper device is turned ON to preserve state and degradation of IC 100. Also, in the illustrated embodiment, by adding the Keeper device to keep the idle state of the wordline driver output), but only pulsing (pulse B is generated—pulse generation circuit is well known and not shown here—to effect the output transition at the required time instant which is the same as the trailing transition of signal A) the gate of the main PFET device to effect the output rising transition. This puts the main PFET device in OFF mode during idle period, thus putting it in relaxation mode for most of its life. The keeper exists to only keep the state low on the output, (not for effecting a transition on the wordline), so a VT shift on the keeper is not important—it will still perform its logic function. The signal A is used to shut off the NFET device, and is also used to turn ON the keeper. Signal Y is an output signal of the BTI circuit 120 for affected circuit stress BTI degradation events of IC 100 of FIG. 1, whereby, VT stress is reduced on functional PFET by keeping IC 100 OFF (VGS=0), during IDLE state of IC 100, and keeping keeper PFET ON, according to embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A circuit structure, comprising:
   a first pfet device; a first nfet device connected to the pfet device; and
   a keeper nfet device that reduces stress associated with the first nfet device by keeping the first nfet device off during its functional state; wherein the keeper nfet device is disposed between the first pfet device and ground and wherein the first pfet device and the keeper nfet device are configured to receive a first pulse, and wherein the first nfet device is configured to receive a second pulse, wherein the second pulse is triggered on a rising edge of the first pulse, and wherein the second pulse is of opposite polarity to the first pulse, and wherein the second pulse has a time delay from a trailing edge of the first pulse, wherein the time delay is independent of the trailing edge of the first pulse.

2. A method for minimizing bias temperature instability degradation of integrated circuits, the method comprising:
   providing a first pfet device;
   providing a first nfet device connected to the pfet device;
   providing a keeper nfet device for reducing stress associated with the first nfet device by keeping the first nfet device off during its functional state; wherein the keeper nfet device is disposed between the first pfet device and ground and wherein the first pfet device and the keeper nfet device are configured to receive a first pulse, and wherein the first nfet device is configured to receive a second pulse, wherein the second pulse is triggered on a rising edge of the first pulse, and wherein the second pulse is of opposite polarity to the first pulse, and wherein the second pulse has a time delay from a trailing edge of the first pulse, wherein the time delay is independent of the trailing edge of the first pulse.

3. A circuit structure, comprising:
   a first pfet device; a first nfet device connected to the pfet device; and
   a keeper pfet device that reduces stress associated with the first pfet device by keeping the first pfet device off during its functional state; wherein the keeper pfet device is disposed between the first nfet device and a positive voltage reference, and wherein the first nfet device and the keeper pfet device are configured to receive a first pulse, and wherein the first pfet device is configured to receive a second pulse, wherein the second pulse is triggered on a rising edge of the first pulse, and wherein the second pulse is of opposite polarity to the first pulse, and wherein the second pulse has a time delay from a rising edge of the first pulse, wherein the time delay is independent of the rising edge of the first pulse.

\* \* \* \* \*